United States Patent
Yamagishi et al.

(10) Patent No.: US 6,791,123 B2
(45) Date of Patent: Sep. 14, 2004

(54) ESD PROTECTION ELEMENT

(75) Inventors: Kazuo Yamagishi, Ohtsu (JP); Kazumi Yamaguchi, Ohtsu (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/259,633

(22) Filed: Sep. 30, 2002

(65) Prior Publication Data

US 2003/0071676 A1 Apr. 17, 2003

(30) Foreign Application Priority Data

Oct. 1, 2001 (JP) .................................. 2001-305255
Oct. 1, 2001 (JP) .................................. 2001-305256

(51) Int. Cl.[7] .............................................. H01L 23/60
(52) U.S. Cl. ........................ 257/174; 257/107; 257/174
(58) Field of Search .......................... 257/107, 173–174, 257/288, 355, 502

(56) References Cited

U.S. PATENT DOCUMENTS 5,372,957 A * 12/1994 Liang et al. ................ 438/302
5,821,586 A * 10/1998 Yamaguchi et al. ........ 257/355
5,903,028 A * 5/1999 Quoirin et al. ............. 257/328
6,060,763 A * 5/2000 Yamagishi et al. ......... 257/577

FOREIGN PATENT DOCUMENTS

JP          406291337 A * 10/1994    ........... H01L/29/90

OTHER PUBLICATIONS

S. Wolf and R.N. Tauber, "Silicon Processing in the VLSI Era, vol. 1—Process Technology", Second Edition, pp. 234–235; Lattice Press, Sunset Beach, California (2000) (ISBN 0–09616721–6–1).*

* cited by examiner

Primary Examiner—Nathan J. Flynn
Assistant Examiner—Johannes Mondt
(74) Attorney, Agent, or Firm—Young & Thompson

(57) ABSTRACT

An $n^-$ type layer 12 is epitaxially grown on one main surface (front surface) of an $n^+$ type silicon substrate 11 and an anode electrode 13 is electrically in contact with the other main surface (rear surface) thereof. A p type region 14 is selectively formed in a surface layer of the $n^-$ type layer 12 and a $n^+$ type region 15 is selectively formed in a surface layer of the p type region 14. A cathode electrode 17 is electrically in contact with a surface of the $n^+$ type region 15.

18 Claims, 4 Drawing Sheets

ESD PROTECTION ELEMENT

BACKGROUND OF THE INVENTION

1. Field of the Invention

The present invention relates to an electrostatic surge protection element for protecting a semiconductor device against surge due to electrostatic discharge (ESD).

2. Description of the Prior Art

ESD tends to destroy or damage a semiconductor device and is an importance factor substantially influencing reliability of the semiconductor device. As shown in FIG. 1, it has been usual in order to protect a semiconductor device 1 against ESD to provide a voltage regulator diode (Zener diode) 2 designed to operate at a predetermined voltage or higher on an input side of the semiconductor device 1.

A general voltage regulator diode used as the ESD protection element will be described with reference to FIG. 2. In FIG. 2, a high impurity density $p^+$ type guard ring region 4 and a $p^+$ type region 5 surrounded by the guard ring region 4 are selectively formed in a surface layer on a main surface (on a surface side) of an $n^+$ type silicon substrate 3, which is a high impurity density n type semiconductor substrate, by injecting or diffusing boron ion as impurity. On the surface of the silicon substrate 3, a silicon oxide film 6 is formed. A metal anode electrode 7 connected to a terminal A is electrically in contact with a surface of the $p^+$ region 5, which is defined by an opening portion of the silicon oxide film 6. Further, a metal cathode electrode 8 connected to a terminal K is electrically in contact with the other main surface of the silicon substrate 3.

The guard ring 4 and the $p^+$ region 5, which are formed between the anode electrode 7 and the cathode electrode 8, and the $n^+$ type silicon substrate 3 forms a single PN junction J1. The PN junction J1 has a parasitic capacitance C1, which is proportional to a junction area thereof.

Besides, in order to satisfy the recent requests of higher speed, that is, higher frequency of an input signal to a semiconductor device, it is necessary to reduce the parasitic capacitance C1 of the voltage regulator diode. However, when the parasitic capacitance C1 is reduced by reducing the junction area of the PN junction J1, durability of the PN junction against ESD, which is in a trade-off relation to the junction area, is degraded.

SUMMARY OF THE INVENTION

An object of the present invention is to provide an ESD protection element for protecting a semiconductor device against electrostatic surge, whose parasitic capacitance can be reduced without reducing a junction area thereof.

An ESD protection element for protecting a semiconductor against electrostatic surge, according to a first aspect of the present invention, includes a high impurity density n type semiconductor substrate having low impurity density layer of one conductivity type (for example, n type) formed epitaxially on one of main surfaces thereof and an anode electrode electrically in contact with the other main surface thereof. A region of the other conductivity type (p type) is selectively formed in a surface layer of the low impurity density n type layer. A high impurity density n type region is formed selectively in a surface layer of the p type region and a cathode electrode is electrically in contact with, a surface thereof.

An ESD protection element for protecting a semiconductor against electrostatic surge, according to a second aspect of the present invention, includes a high impurity density n type semiconductor substrate having low impurity density layer of n conductivity type formed epitaxially on one of main surfaces thereof and an anode electrode electrically in contact with the other main surface thereof. A p type region is selectively formed in a surface layer of the low impurity density n type layer. A first high impurity density n type region is formed selectively in a surface layer of the p type region and having a cathode electrode electrically in contact with a surface thereof. And a second high impurity density n type region is formed simultaneously with the formation of the first high impurity density n type region such that it extends over the surface layer of the low impurity density n type layer and a surface layer of the p type region.

In this ESD protection element, the second high impurity density n type region is preferably formed by non-continuous regions arranged in a line surrounding the first high impurity density n type region.

DETAILED DESCRIPTION OF THE PREFERRED EMBODIMENTS

Figure 3:
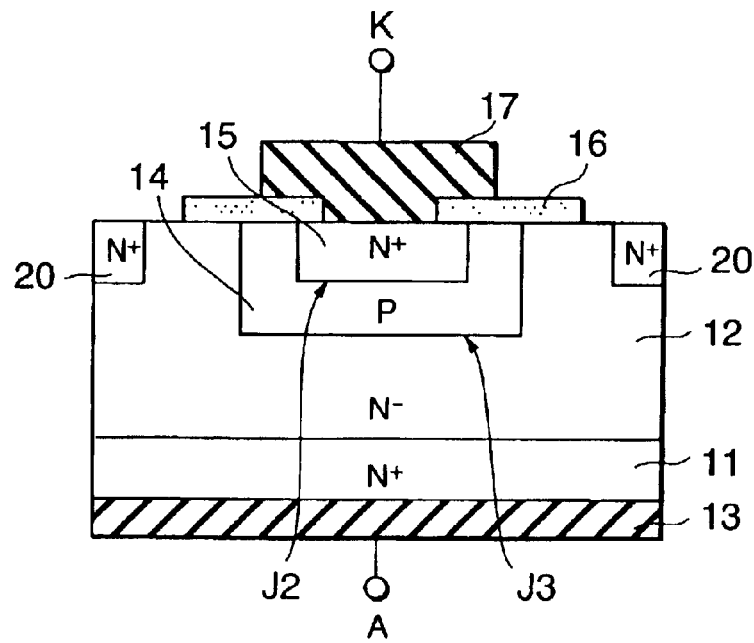
FIG. 3 is a cross sectional view of a main portion of a bidirectional diode according to an embodiment of the present invention.

A bidirectional diode formed in an n type semiconductor substrate will be described with reference to FIG. 3 as an ESD protection element according to an embodiment of the present invention. In FIG. 3, an $n^-$ type layer 12, which is a low impurity density n type semiconductor layer, is epitaxially grown on an $n^+$ type silicon substrate 11, which is a high impurity density n type semiconductor substrate, on one of main surfaces thereof and an anode electrode 13 connected to a terminal A is provided on the other main surface in electrical contact with the other main surface thereof.

A p type region 14 whose impurity density is higher than that of the $n^-$ type layer 12 is selectively formed in the $n^-$ type layer 12 by ion injection or diffusion of boron as impurity to a surface layer of the $n^-$ type layer 12. An $n^+$ type region 15 is selectively formed in a surface layer of the p type region 14 by ion injection or diffusion of phosphor or arsenic as impurity. A silicon oxide film 16 is formed on a surface of the $n^-$ type layer 12 in which these regions are formed. In forming the $n^+$ type region 15, an $n^+$ type channel stopper region 20 is simultaneously formed around the n+ type region 15. A role of the channel stopper region 20 is to prevent current from leaking from the p type region 14 (base) to an outer peripheral portion thereof when conductivity is reversed (channeled) from n− type to p type in an interface between the surface of the n− type layer 12 and the oxide film. For this purpose, the surface impurity density is increased.

A cathode electrode 17 connected to a terminal K is electrically in contact with a surface of the n+ type region 15 through an opening of the silicon oxide film 16.

With this construction of the bidirectional diode, a series connection of a backward PN junction J2 formed by the p type region 14 and the n+ type region 15 and a forward PN junction J3 formed by the p type region 14 and the n− type layer 12 is provided between the cathode electrode 17 and the anode electrode 13.

Figure 4:
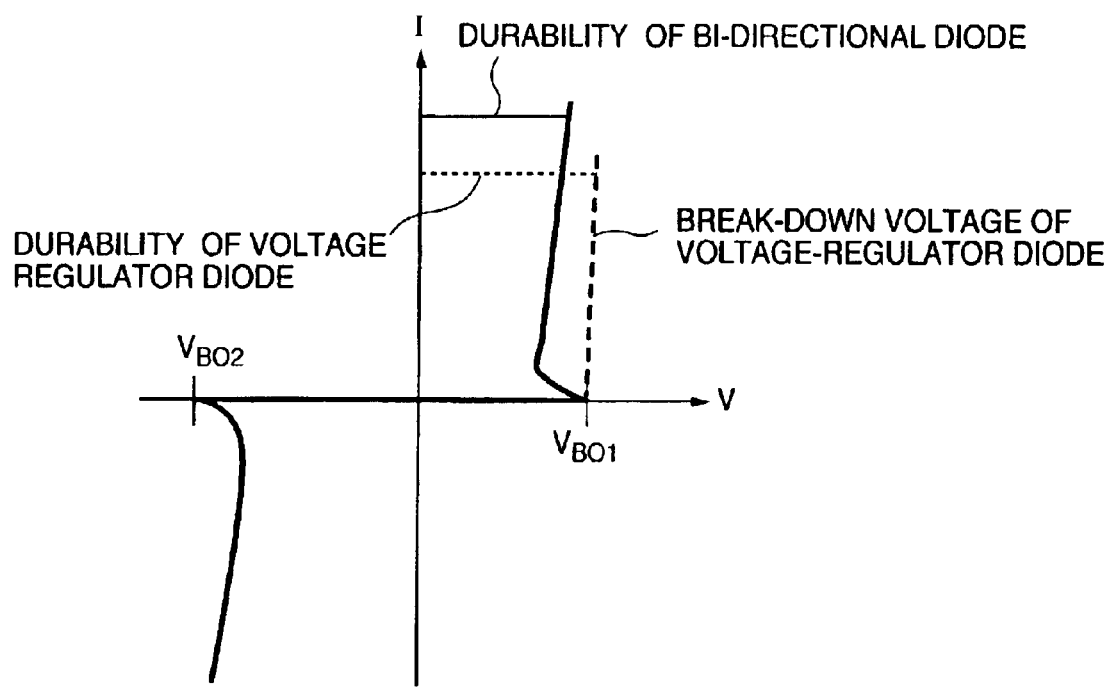
FIG. 4 is a voltage-current characteristics of the bidirectional diode shown in FIG. 3.

FIG. 4 shows a voltage-current characteristics of the bidirectional diode constructed as mentioned above. In FIG. 4, the terminal A is maintained at ground potential and a positive or negative voltage applied to the terminal K is shown as + or − direction. When a positive voltage is applied to the terminal K, a breakdown of the diode occurs at a break-over voltage $V_{BO1}$ (corresponds to Vz of the voltage regulator diode) slightly higher than a breakdown voltage of the PN junction J2. When a negative voltage is applied to the terminal K, a breakdown occurs at a break-over voltage $V_{BO2}$ slightly higher than a breakdown voltage of the PN junction J3, that is, higher than the breakdown voltage $V_{BO1}$. Thereafter, the breakdown voltages in the + and − directions are reduced sharply by the transistor effect, so that a negative resistance waveform is obtained.

Therefore; a parasitic capacitance C2 of the PN junction J2 and a parasitic capacitance C3 of the PN junction J3 are connected in series, resulting in a capacitance Cw, which is represented by the following equation:

$$Cw = C2 \times C3/(C2+C3) \qquad (1)$$

Figure 2:
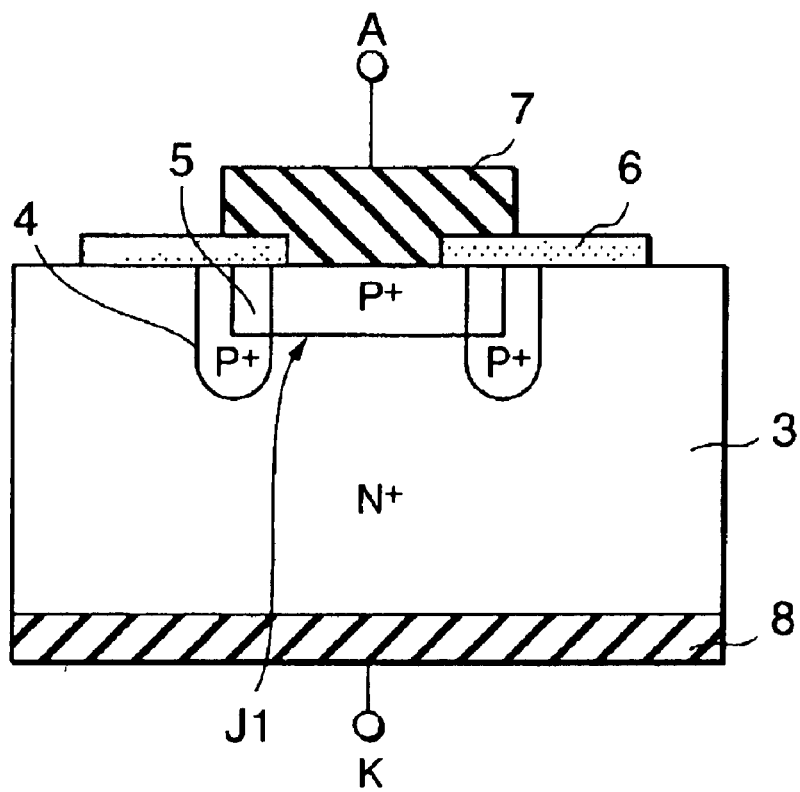
FIG. 2 is a cross sectional view of a main portion of a conventional voltage regulator diode.

Now, the parasitic capacitance C2 of the PN junction J2 of the diode mentioned above will be compared with the capacitance C1 of the PN junction J1 of the conventional voltage regulator diode shown in FIG. 2 when a voltage applied to the terminal K is 0V.

It is assumed that the junction area of the PN junction J2 is equal to that of the PN junction J1 and the n type impurity density of the n+ type region 15 is substantially equal to that of the n+ type silicon substrate 3. In such case, since the p type impurity density of the p type region 14 on the P side of the PN junction J2 is lower than that of guard ring region 4 and that of the p+ type region 5 on the P side of the PN junction J1, a depletion layer of the PN junction J2 spreads more than that of the PN junction J1 and the parasitic capacitance C2 becomes smaller than the parasitic capacitance C1.

When, in order to make the ESD durability higher than that of the conventional voltage regulator diode, the junction area of the PN junction J2 is made larger than the junction area of the PN junction J1, the parasitic capacitance C2 becomes larger compared with a case where the junction areas of the PN junctions J2 and J1 are the same. It is assumed that the diode is designed by taking the above relation into consideration such that the parasitic capacitance C2 is represented by the following equation (2).

$$C2 \approx C1 \qquad (2)$$

In the PN junction J3, the parasitic capacitance C3 thereof becomes larger than that when the junction area thereof is equal to that of the PN junction J2 since the junction area of the PN junction J3 is larger than that of the PN junction J2. However, since the n− type layer 12 on the N side of the PN junction J3 is formed by epitaxial growth, the n type impurity density of the n− type layer 12 can be made lower than that of the n+ type region 15 on the N side of the PN junction J2 by, for example, one figure or more. Therefore, it is possible to make the spread of depletion layer of the PN junction J3 larger than that of the PN junction J2 to thereby reduce the parasitic capacitance C3 to a half or smaller of the parasitic capacitance C2 (≈C1). Under this consideration, it is assumed that the diode is designed such that the parasitic capacitance C3 is represented by the following equation (3):

$$C3 \approx C1/2 \qquad (3)$$

Thus, by inserting the equations (2) and (3) to the equation (1), the capacitance Cw is represented by the following equation (4):

$$Cw \approx C1 \times (C1/2)/(C1+C1/2) = C1/3 \qquad (4)$$

From the equation (4), it is clear that the capacitance Cw can be reduced to about one third of the capacitance C1 of the conventional voltage regulator diode.

Figure 1:
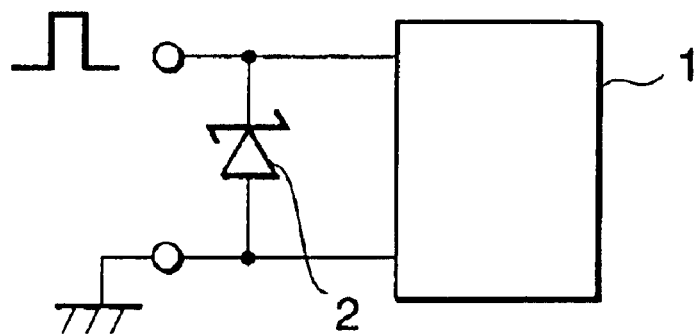
FIG. 1 is a circuit diagram using a conventional ESD protection element for protecting a semiconductor device against electrostatic surge.

An operation of the bidirectional diode when the latter is used as the ESD protecting element of the semiconductor device 1 in lieu of the voltage regulator diode 2 shown in FIG. 1 will be described.

When an input signal of the semiconductor device 1 whose voltage is the break over voltage $V_{BO1}$ or lower is supplied to the terminal K with the terminal A being ground potential, the PN junction J2 of the bidirectional diode is reverse-biased and the depletion layer spreads on the side of the p type region 14. Therefore, the parasitic capacitance Cw is further reduced from that when the applied voltage is 0V, so that it is possible to satisfy the requests of increased speed or frequency of the input signal of the semiconductor device 1 to be protected against ESD.

In a case where the ESD voltage is applied to the terminal K with the terminal A being ground potential, the break down of the bidirectional diode occurs temporarily at the break-over voltage $V_{BO1}$ as shown in FIG. 4. Thereafter, the breakdown voltage is lowered by the negative resistance waveform due to the transistor effect and, in such state, a current due to ESD flows. In general, the ESD destruction of the PN junction occurs due to local thermal destruction thereof by power of (breakdown voltage)×(breakdown current). Therefore, when the break-over voltage $V_{BO1}$ of the bidirectional diode is equal to Vz of the voltage regulator diode, the breakdown current of the bidirectional diode as the ESD durability to the thermal destruction can be made larger than that of the voltage regulator diode by an amount corresponding to the reduction of the breakdown voltage due to the negative resistance waveform, as shown in FIG. 4. Therefore, it is possible to increase the ESD durability with which ESD voltage in the bidirectional diode can be absorbed.

For reference, a concrete example of preferable values of the components in the described embodiment will be described.

Thickness of the n+ type silicon substrate 11 is 440 μm (final thickness is 160 μm) and resistivity thereof is 1~6×$10^{-3}$ Ω·cm (arsenic added). Thickness of the n− type layer 12 is 6.3±0.4 μm and resistivity thereof is 0.5±0.04 Ω·cm.

Base depth of the p type region 14 is 2.5 μm and a standard of base density thereof is 5×$10^{18}$/cm³~5×$10^{19}$/cm³. Base area of the p type region 14 is 0.0196 mm². Emitter depth of the n+ type region 15 is 1 μm and a standard of emitter density is $1\times10^{20}/cm^3\sim1\times10^{21}/cm^3$. Emitter area of the n+ type region 15 is 0.0064 mm².

As the anode electrode 13 for ohmic contact, a Ti/Au/Sb/Au alloy or a Ti/Ni/Ag alloy is preferable and, as the cathode electrode 17, aluminum can be used.

Figure 5A:
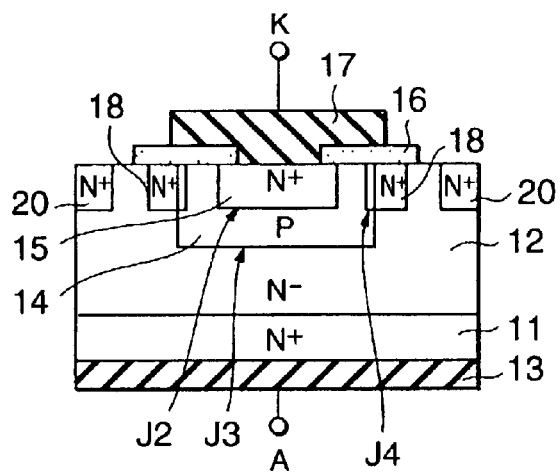
FIG. 5A is a cross sectional view of a main portion of a bidirectional diode according to another embodiment of the present invention.
Figure 5B:
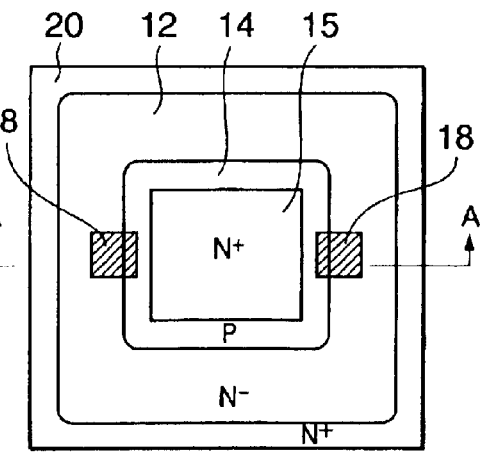
FIG. 5B is a plan view of the bidirectional diode shown in FIG. 5A, with electrodes and an oxide film being removed.

Now, a bidirectional diode as the ESD protecting element according to another embodiment of the present invention will be described with reference to FIG. 5A and FIG. 5B.

An n⁻ type layer 12, which is a low impurity density n type semiconductor layer, is epitaxially grown on one of main surfaces (front surface) of an n+ type silicon substrate 11, which is a high impurity density n type semiconductor substrate, and an anode electrode 13 connected to a terminal A is provided on the other main surface (rear surface) in electrical contact with the rear surface.

A p type region 14 whose impurity density is higher than that of the n⁻ type layer 12 is selectively formed in a front surface layer of the n⁻ type layer 12 by ion injection or diffusion of boron as impurity to the surface layer of the n⁻ type layer 12. The formation of the region 14 is the same as that in the described embodiment. A first n+ type region 15 is selectively formed in a surface layer of the p type region 14 by ion injection or diffusion of phosphor or arsenic as impurity and, simultaneously therewith, second n+ type regions 18 are formed in the surface layer around the first n+ type region 15. The second n⁻ type regions 18 are provided discretely and extend over the surface layer of the n⁻ type layer 12 and the surface layer of the p type region 14. Simultaneously with the formation of the first and second n+ type regions 15 and 18, a n+ type channel stopper region 20 is formed in a periphery of the diode. A silicon oxide film 16 is formed on a surface of the n⁻ type layer 12 in which these regions are formed. A cathode electrode 17 connected to a terminal K is electrically in contact with a surface of the n+ type region 15 through an opening of the silicon oxide film 16.

With this construction of the bidirectional diode, a series connection of a backward PN junction J2 formed by the p type region 14 and the n+ type region 15 and a forward PN junction J3 formed by the p type region 14 and the n⁻ type layer 12 is provided between the cathode electrode 17 and the anode electrode 13. Further, a forward PN junction J4 between the p type region 14 and the second n+ type region 18 is connected in parallel with the PN junction J3 by forming the second high impurity density n type region extending over the surface layer of the low impurity density n type layer and a surface layer of the p type region and formed by non-continuous regions surrounding the first high impurity density n type region.

Figure 6:
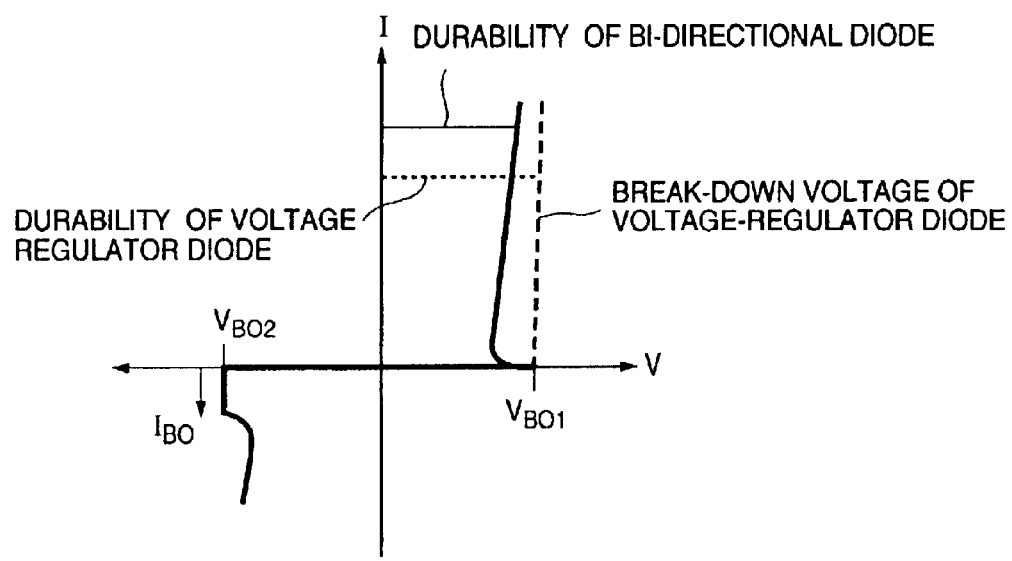
FIG. 6 is a voltage-current characteristics of the bidirectional diode shown in FIG. 5A.

FIG. 6 shows a voltage-current characteristics of the bidirectional diode constructed as mentioned above. In FIG. 6, the terminal A is maintained at ground potential and a positive or negative voltage applied to the terminal K is shown as + or – direction. When a positive voltage is applied to the terminal K, a breakdown of the diode occurs at a break-over voltage $V_{BO1}$ (corresponds to Vz of the voltage regulator diode) slightly higher than a breakdown voltage of the PN junction J2. Thereafter, the breakdown voltage is sharply reduced by the transistor effect and the negative resistance waveform is provided.

On the other hand, when a negative voltage is applied to the terminal K, a breakdown occurs at a break-over voltage $V_{BO2}$ slightly higher than the breakdown voltage of the PN junction J4, that is, substantially equal to the breakdown voltage $V_{BO1}$ since the breakdown voltage does not become higher than the breakdown voltage of the PN junction J3. Thereafter, the breakdown voltage is sharply reduced by the transistor effect after current $I_{BO}$ flows with the breakdown voltage being $V_{BO2}$, resulting in the negative resistance waveform.

Therefore, it is possible to substantially equalize the breakdown voltage $V_{BO1}$ and the breakdown voltage $V_{BO2}$. It is clear that, when the semiconductor device is a MOSIC, there is a problem that the semiconductor device 1 is broken by an excess negative voltage input if $V_{BO2}$ is larger than $V_{BO1}$ and a breakdown voltage of the gate insulating oxide film of an input portion thereof is smaller than $V_{BO2}$. However, since the breakdown voltages are equal, it is possible to protect the semiconductor device against the excess negative voltage input thereto.

A capacitance Cp of a parallel connection of the parasitic capacitances C3 and C4 of the PN junctions J3 and J4 is represented by the following equation (5):

$$Cp = C3 + C4 \quad (5)$$

and a capacitance Cpw of a series connection of the capacitance Cp and a parasitic capacitance C2 of the PN junction J2 is represented by the following equation (6):

$$Cpw = C2 \times Cp/(C2+Cp) \quad (6)$$

Now, this is compared with the parasitic capacitance C1 of the PN junction J1 of the voltage regulator diode when a voltage applied to the terminal K is 0V will be described.

It is assumed in the PN junction J2 that the junction area of the PN junction J2 of the bidirectional diode is equal to that of the PN junction J1 and the n type impurity density of the first n+ type region 15 is substantially equal to that of the n+ type silicon substrate 3. In such case, since the p type impurity density of the p type region 14 on the P side of the PN junction J2 is lower than that of guard ring region 4 and that of the p+ type region 5 on the P side of the PN junction J1, a depletion layer of the PN junction J2 becomes larger than that of the PN junction J1 and the parasitic capacitance C2 becomes smaller than the parasitic capacitance C1.

When, in order to make the ESD durability of the bidirectional diode larger than that of the conventional voltage regulator diode, the junction area of the PN junction J2 is made larger than the junction area of the PN junction J1, the parasitic capacitance C2 becomes larger compared with a case where the junction areas of the PN junctions J2 and J1 are the same. It is assumed that the bidirectional diode is designed by taking the above relation into consideration such that the parasitic capacitance C2 is represented by the equation (2) (C2≈C1).

Since the junction area of the PN junction J3 is larger than the junction area of the PN junction J2, the parasitic capacitance C3 thereof becomes larger than that when the junction area thereof is equal to that of the PN junction J2. However, since the n⁻ type layer 12 on the N side of the PN junction J3 is formed by epitaxial growth, the n type impurity density of the n⁻ type layer 12 can be made lower than that of the n+ type region 15 on the N side of the PN junction J2 by, for example, one figure or more. Therefore, it is possible to make the spread of depletion layer of the PN junction J3 larger than that of the PN junction J2 to thereby reduce the parasitic capacitance C3 to a half or smaller of the parasitic capacitance C2 (≈C1). Under this consideration, it is assumed that the bidirectional diode is designed such that the parasitic capacitance C3 is represented by the equation (3) (C3≈C1/2).

In the PN junction J4, although the p type impurity density on the P side and the n type impurity density on the N side are the same as those of the PN junction J2, the junction area of the PN junction J4 can be designed very small compared with that of the PN junction J2. Therefore, the parasitic capacitance C4 is negligible with respect to the parasitic capacitance C2. According thus, it is assumed that the parasitic capacitance C4 is represented by the following equation (7):

$$C4 \approx 0 \qquad (7)$$

Thus, by inserting the equations (3) and (7) to the equation (5), the capacitance Cp is represented by the following equation (8):

$$Cp \approx C1/2 \qquad (8)$$

Further, by inserting the equations (2) and (8) into the equation (6), the capacitance Cpw is represented by the following equation (9):

$$Cpw \approx C1 \times (C1/2)/(C1+C1/2) = C1/3 \qquad (9)$$

From the equation (9), it is clear that the capacitance Cpw can be reduced to about one third of the conventional voltage regulator diode.

An operation of the above mentioned bidirectional diode when the latter is used as the ESD protecting element of the semiconductor device 1 in lieu of the voltage regulator diode 2 shown in FIG. 1 will be described.

When an input signal of the semiconductor device 1 whose voltage is the break-over voltage $V_{BO1}$ or lower is supplied to the terminal K with the terminal A being ground potential, the PN junction J2 of the bidirectional diode is reverse-biased and the depletion layer spreads on the side of the p type region 14. Therefore, the parasitic capacitance Cw is further reduced from that when the applied voltage is 0V, so that it is possible to satisfy the requests of increased speed or frequency of the input signal of the semiconductor device 1 to be protected against ESD.

In a case where the ESD voltage is applied to the terminal K with the terminal A being ground potential, the bidirectional diode exhibits a characteristics shown in FIG. 6. That is, the breakdown of the bidirectional diode occurs temporarily at the break-over voltage $V_{BO1}$ and, thereafter, current due to ESD flows when the breakdown voltage is lowered by the negative resistance waveform due to the transistor effect. The ESD destruction in the PN junction generally occurs due to local thermal destruction by power of (breakdown voltage)×(breakdown current).

Therefore, when the break over voltage $V_{BO1}$ of the bidirectional diode is equal to Vz of the voltage regulator diode, the breakdown current of the bidirectional diode as the ESD durability to the thermal destruction can be made larger than that of the voltage regulator diode by an amount corresponding to the reduction of the breakdown voltage due to the negative resistance waveform, as shown in FIG. 6. Therefore, it is possible to increase the ESD durability with which ESD voltage in the bidirectional diode can be absorbed.

In this embodiment, the same concrete example of the various values as that mentioned in the previous embodiment can be used in this embodiment.

Figure 7:
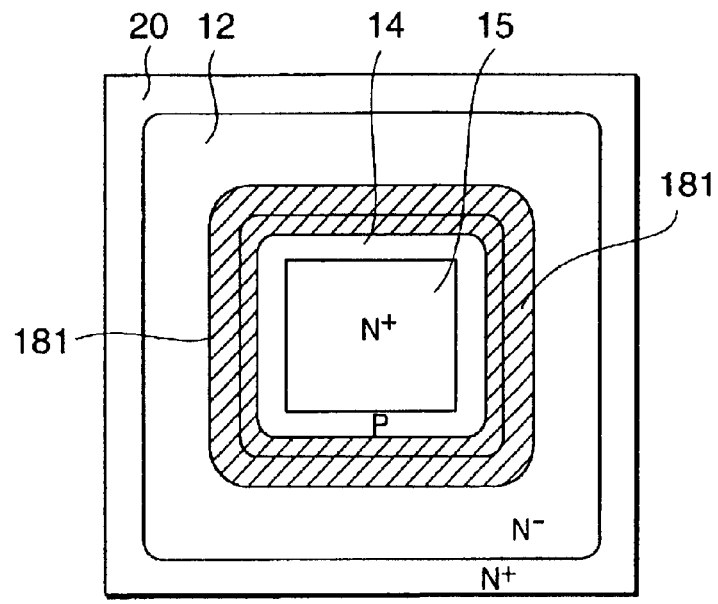
FIG. 7 is a plan view of a modification of the bidirectional diode shown in FIG. 5B.

Incidentally, the second n⁺ type region 18 was described as being formed by the discrete regions arranged in the peripheral direction surrounding the first n⁺ type region 15. However, when the gradient of the current $I_{BO}$ is large as shown in FIG. 6, the second n⁺ type region 18 can be formed as a single ring 181 as shown in FIG. 7 so that a resistance value on the $V_{BO2}$ side of the bidirectional diode is reduced.

Figure 8:
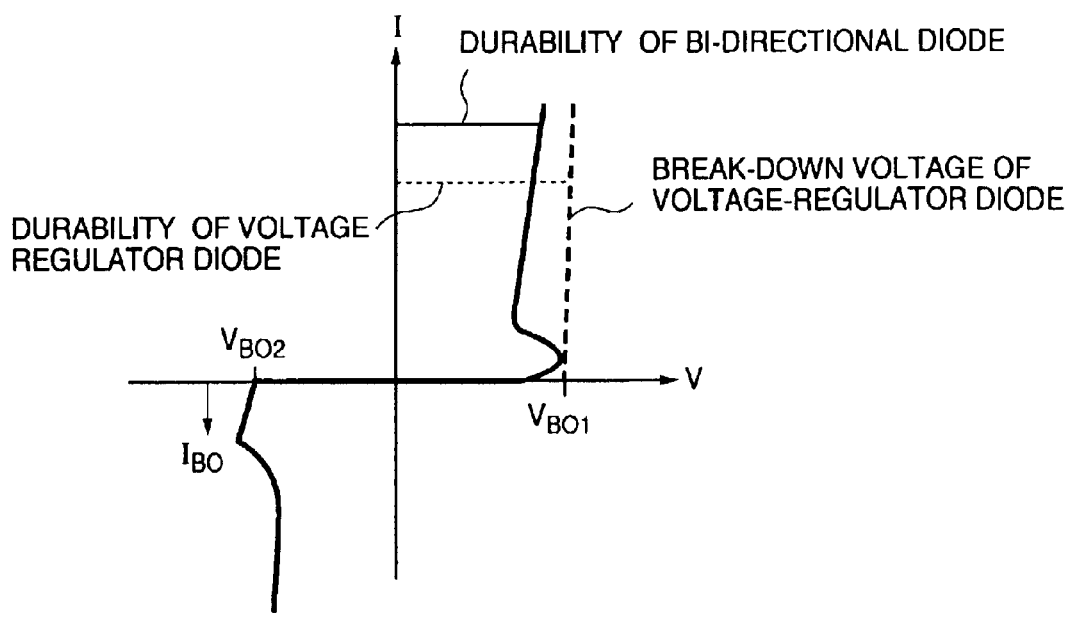
FIG. 8 is a voltage-current characteristics of the bidirectional diode shown in FIG. 7.

By employing the ring shaped second n⁺ type region 181, it is possible to make the gradient of current $I_{BO}$ small as shown in FIG. 8 although the parasitic capacitance becomes large due to an increased area of the second n⁺ type region 181.

As described hereinbefore, the element for protecting a semiconductor device against ESD, according to the present invention, is constructed with the series connection of the reverse-connected PN junction J2 between the p type region and the high impurity density n type region and the forward-connected PN junction J3 between the p type region and the low impurity density n type layer. With this construction, the parasitic capacitances C2 and C3 thereof are connected in series, so that it is possible to make the resultant capacitance Cw smaller than the parasitic capacitance C1 of the PN junction J1 of the conventional voltage regulator diode. Further, the breakdown voltage-breakdown current waveform of this element becomes negative resistance type, so that the ESD durability becomes higher than that of the voltage regulator diode. By employing such element for protecting the semiconductor device against ESD, it is possible to satisfy the requests of increased speed or frequency of the input signal of the semiconductor device 1 to be protected against ESD.

In the embodiment in which the second high impurity density n type region extending over the surface layers of the low impurity density n type layer and the p type region is formed in the discrete regions arranged in the peripheral direction surrounding the first high impurity density n type region, simultaneously with the formation of the first high impurity density n type region, it is possible to make the break-over voltage $V_{BO}$ in both directions substantially equal without substantially increasing the capacitance. Therefore, in addition to the protection of the semiconductor device against negative excessive voltage input, it is possible to satisfy the requests of increased speed or frequency of the input signal of the semiconductor device.

Incidentally, it should be noted that the conductivity types of the semiconductor regions constituting the element are not limited to those described hereinbefore and the present invention can also be applied to an ESD protecting element constituted with regions having opposite conductivity types to those described.

What is claimed is:

1. An element for protecting a semiconductor device against electrostatic surge, comprising:

a high impurity density n type semiconductor substrate having a low impurity density n type layer epitaxially grown on one of main surfaces of said high impurity density n type semiconductor substrate;

an anode electrode provided on the other main surface of said high impurity density n type semiconductor substrate;

a p type region selectively formed in a surface layer of said low impurity density n type layer;

a first high impurity density n type region selectively formed in said p type region;

a second high impurity density n type region extending from said surface layer of said p type region in which said first high impurity density n type region is formed to said surface layer of said low impurity density n type layer, the second high impurity density n type region having an inner vertical perimeter portion contacting said p type region and an outer vertical perimeter portion extending into and contacting with said low impurity density n type layer;

a silicon oxide film formed on and covering all upper surfaces of said p type region and said second high impurity density n type region; and a cathode electrode electrically in contact with said first high impurity density n type region.

2. An element for protecting a semiconductor device against electrostatic surge, as claimed in claim 1, wherein said second high impurity density n type region is formed by discrete regions arranged in a peripheral direction surrounding said first high impurity density n type region.

3. An element for protecting a semiconductor device against electrostatic surge, as claimed in claim 1, wherein said second high impurity density n type region is a continuous ring formed in a peripheral direction surrounding said first high impurity density n type region.

4. An element for protecting a semiconductor device against electrostatic surge, as claimed in claim 1, wherein said second high impurity density n type region is formed simultaneously with the formation of said first high impurity density n type region.

5. An element for protecting a semiconductor device against electrostatic surge, as claimed in claim 1, further comprising a silicon oxide film formed on a surface of said second high impurity density n type region.

6. An electrostatic surge protection device, comprising:

a high impurity density n type semiconductor substrate;

a low impurity density n type epitaxial layer contacting a first upper surface of the substrate;

an anode electrode contacting a second lower surface of the substrate;

a p type region contiguously formed in a surface layer of the low impurity density n type epitaxial layer as a single discrete region;

a first high impurity density n type region formed in the p type region;

a second high impurity density n type region extending from the low impurity density n type epitaxial layer to the p type region, the second high impurity density n type region having an inner vertical perimeter portion contacting said p type region and an outer vertical perimeter portion extending into and contacting with said low impurity density n type layer;

a silicon oxide film formed on and covering all upper surfaces of said p type region and said second high impurity density n type region; and a cathode electrode electrically in contact with the first high impurity density n type region.

7. The electrostatic surge protection device of claim 6, wherein, the second high impurity density n type region comprises plural discrete regions arranged in a peripheral direction surrounding the first high impurity density n type region.

8. The electrostatic surge protection device of claim 6, wherein, the second high impurity density n type region comprises a continuous ring formed in a peripheral direction surrounding the first high impurity density n type region.

9. The electrostatic surge protection device of claim 6, wherein, the first high impurity density n type region and the second high impurity density n type region have coplanar upper and lower surfaces.

10. The electrostatic surge protection device of claim 6, further comprising a silicon oxide film formed on a surface of second high impurity density n type region and over at least a part of the first high impurity density n type region.

11. An electrostatic surge protection device, comprising:

a high impurity density n type semiconductor substrate;

a low impurity density n type epitaxial layer contacting a first upper surface of the substrate;

a first electrode contacting a second lower surface of the substrate;

a p type region contiguously formed in a surface layer of the low impurity density n type epitaxial layer as a single discrete region with a continuous perimeter;

a first high impurity density n type region formed in the p type region;

a second high impurity density n type region extending from the low impurity density n type epitaxial to the p type region, the second high impurity density n type region having an inner vertical perimeter portion contacting said p type region and an outer vertical perimeter portion extending into and contacting with said low impurity density n type layer;

a silicon oxide film formed on and covering all upper surfaces of said p type region and said second high impurity density n type region; and a second electrode electrically in contact with the first high impurity density n type region.

12. The electrostatic surge protection device of claim 11, wherein, the second high impurity density n type region comprises plural discrete regions arranged in a peripheral direction surrounding the first high impurity density n type region.

13. The electrostatic surge protection device of claim 11, wherein, the second high impurity density n type region comprises a continuous ring formed in a peripheral direction surrounding the first high impurity density n type region.

14. The electrostatic surge protection device of claim 11, wherein, the first high impurity density n type region and the second high impurity density n type region have coplanar upper and lower surfaces.

15. The electrostatic surge protection device of claim 11, further comprising a silicon oxide film formed on a surface of second high impurity density n type region and over at least a part of the first high impurity density n type region.

16. The element of claim 1, wherein the second high impurity density n type region has the inner vertical perimeter portion extending into said p type region.

17. The device of claim 6, wherein the second high impurity density n type region has the inner vertical perimeter portion extending into said p type region.

18. The device of claim 11, wherein the second high impurity density n type region has the inner vertical perimeter portion extending into said p type region.

* * * * *